United States Patent [19]

Boettcher

[11] 4,272,774

[45] Jun. 9, 1981

[54] SELF-ALIGNED FLOATING GATE MEMORY CELL AND METHOD OF MANUFACTURE

[75] Inventor: Charles E. Boettcher, Sandy, Utah

[73] Assignee: National Semiconductor Corporation, Santa Clara, Calif.

[21] Appl. No.: 59,235

[22] Filed: Jul. 19, 1979

[51] Int. Cl.³ ............................................... H01L 29/78
[52] U.S. Cl. ........................................ 357/23; 357/54; 357/59
[58] Field of Search ............................. 357/23, 54, 59

[56] References Cited

U.S. PATENT DOCUMENTS

| 3,984,822 | 10/1976 | Simko | 340/173 R |
| 3,996,657 | 12/1976 | Simko | 29/571 |
| 4,004,159 | 1/1977 | Rai | 307/238 |
| 4,104,784 | 8/1978 | Klein | 29/571 |
| 4,142,926 | 3/1979 | Morgan | 148/187 |

Primary Examiner—Martin H. Edlow
Attorney, Agent, or Firm—Gail W. Woodward; James A. Sheridan

[57] ABSTRACT

A floating gate memory cell has its control gate self-aligned to the floating gate in the source to drain direction and its floating gate self-aligned to the channel region in that direction and the direction transverse thereto without overlaying the field oxide. The cell may be manufactured by the following method: forming insulation such as silicon oxide over the substrate to serve as gate oxide; forming a conductor such as polysilicon over the insulation; etching the polysilicon to a patterned mask and using the mask to dissolve the unprotected oxide to leave a future floating gate of polysilicon overlaying and coextensive with the future channel region in the direction transverse to the source-to-drain region; overlaying insulation such as a further oxide and then overlaying a second conductor such as polysilicon, which is thus insulated from the floating gate; patterning this second polysilicon, which will serve as a control gate, with a photo resist mask to etch the second conductor to form a control gate, and to preferentially remove enough oxide to expose the unmasked portion of the future floating gate, and etching this unmasked portion. Thus, the floating gate is self-aligned to the channel in the source-to-drain direction, as well as in the direction transverse to the source-to-drain direction. The remaining insulation may now be dissolved using the gates as masks to expose the source and drain regions.

10 Claims, 10 Drawing Figures

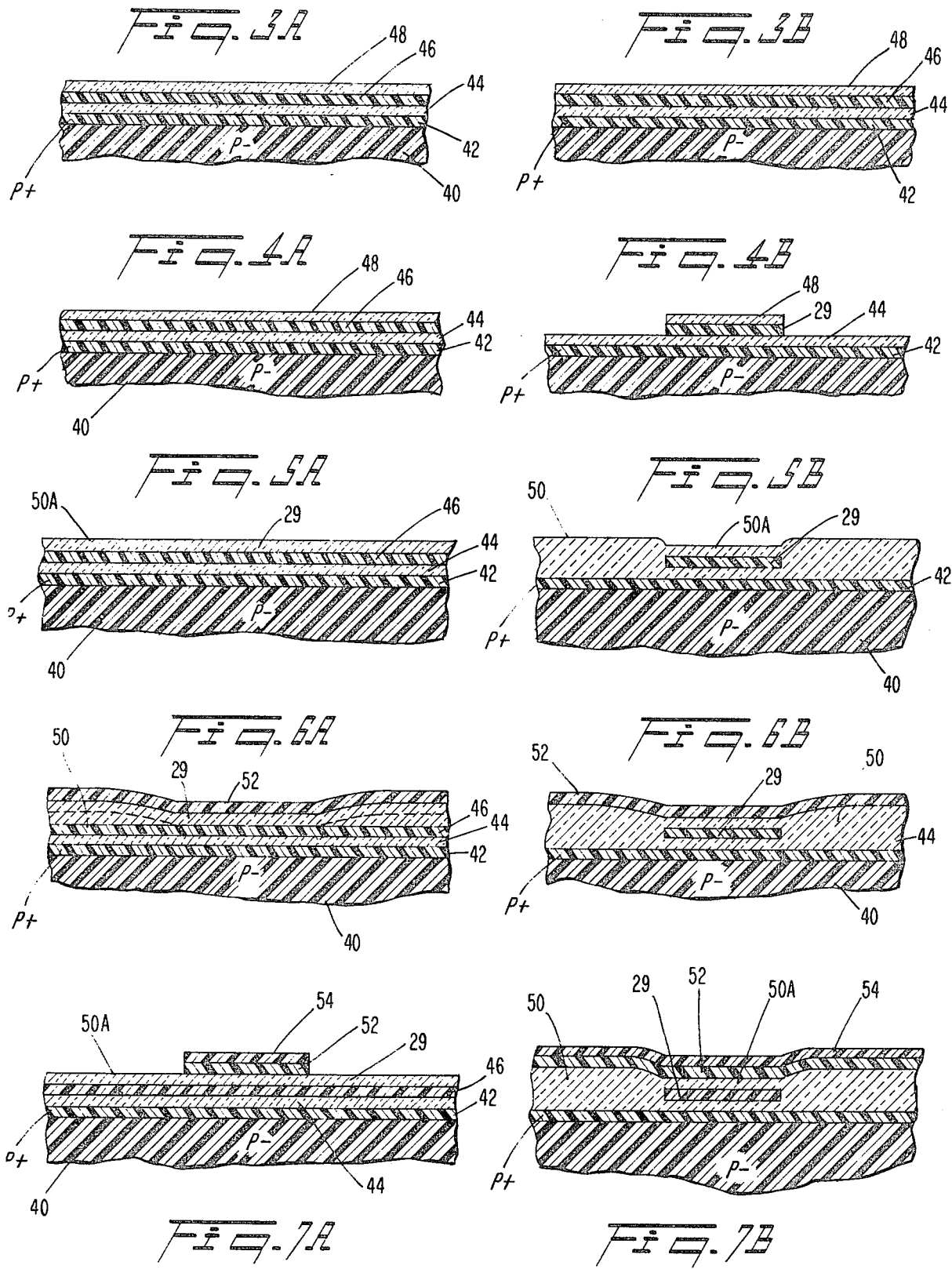

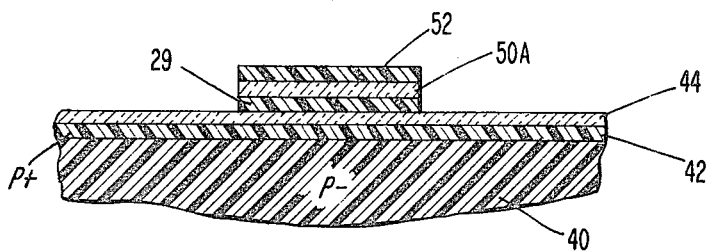
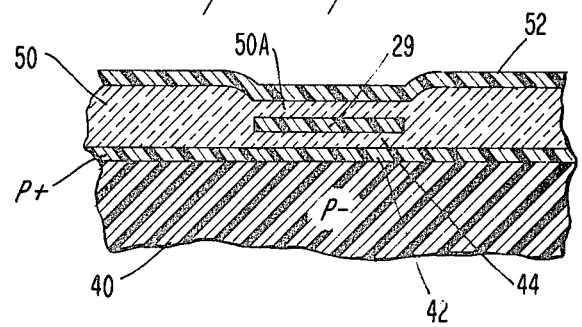
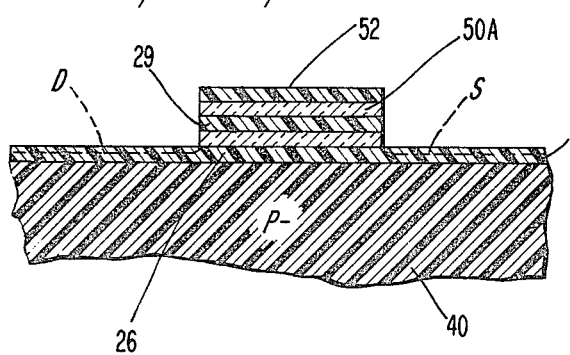
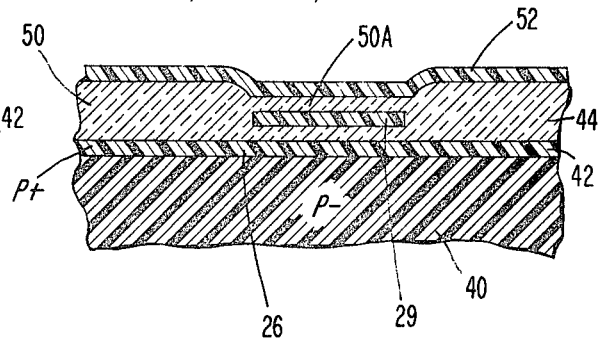
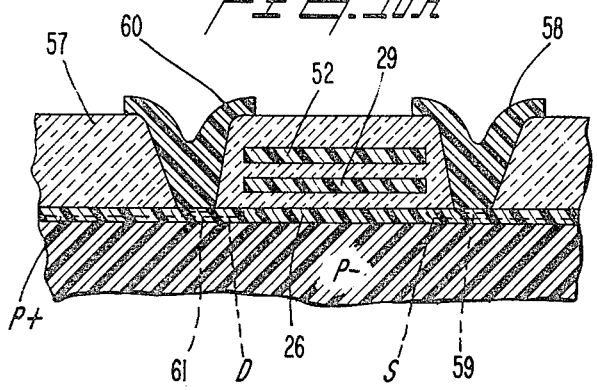
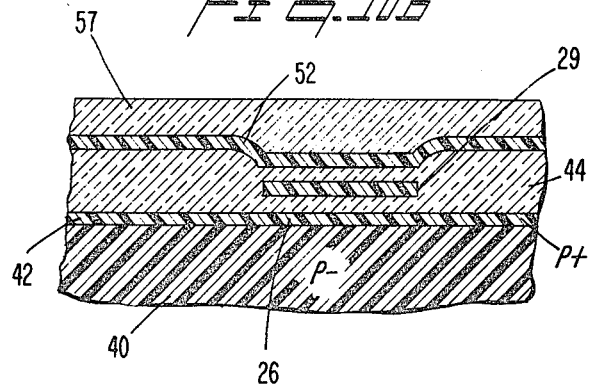

4,272,774

SELF-ALIGNED FLOATING GATE MEMORY CELL AND METHOD OF MANUFACTURE

BACKGROUND OF THE INVENTION

The invention relates generally to memory cells and more particularly of the type of memory cells employing a floating gate. This type of memory cell is a field effect transistor having source and drain regions connected by a channel region, a floating gate insulated from the channel and closely adjacent thereto, and a control gate insulated from and closely adjacent to the floating gate. As understood in the art by applying a suitable voltage between the control gate and the source or drain of the transistor, a charge may be trapped upon the floating gate which is insulated from the remainder of the structure. This charge influences the current which may be drawn through the underlying channel and permits by suitable means a determination of whether a charge is stored upon the floating gate or not. The floating gate may be discharged for example by a suitable voltage, of opposite polarity. Operation of the control gate with voltages less than those required to change the state of charge of the floating gate may be employed to determine whether there is a charge trapped upon the floating gate or not. Thus, such memories may be used as read-only memories, but the memories are erasable, so that they are known by the somewhat incongruous name of erasable or programmable read-only memories. In the manufacture of memories of the type using floating gate memory cells, it is desirable to pack as many cells as possible on the surface of the substrate.

One of the prior art floating gate memory cells is exemplified by U.S. Pat. No. 3,984,822 issued Oct. 5, 1976 to Simko et al. The patent describes a memory cell in which the floating gate is, as described in the art, self-aligned with respect to the source and drain. The term implies that the margins of the floating gate are used as a mask to determine the extent of the source and drain on the surface of the underlying substrate.

An erasable read only memory product employs cells of a type somewhat similar to those described in the above-identified patent except that in the product also the floating gate in the direction transverse to the source to the drain direction extended beyond the channel region of the transistor over the field oxide, namely, looking at the center section of the device, beyond the channel region in the direction at right angles to the source to drain direction.

SUMMARY OF THE INVENTION

According to the invention, the floating gate is self-aligned to the channel region in the direction perpendicular to the source to drain direction, without overlaying the field oxide. Thereafter, the control gate is formed and, as will be seen, the control gate is self-aligned to the floating gate in the source to drain direction and thereby the floating gate is self-aligned also in the source to drain direction to the channel. In this fashion the margins of the floating gate in both of these directions and the margins of the control gate in the source to drain direction do not extend beyond the minimal directions required to perform their respective functions. Accordingly, a greater packing density upon the substrate for like performance may be achieved.

DESCRIPTION OF THE DRAWINGS

The various objects, advantages and novel features of the invention will be more fully apparent from the following detailed description when read in connection with the accompanying drawings in which:

FIGS. 3A through 10A illustrate various stages of the device of FIG. 2 in preparation as viewed along the partial cross-section line A—A of FIG. 2; and FIGS. 3B through 10B respectively illustrate various stages of the device in preparation along the partial cross-section line B—B of FIG. 2. Figures with corresponding numerals 3 to 10 relate to corresponding stages of the method of producing the device.

PRIOR ART

In the prior art U.S. Pat. No. 3,984,822 to Simko noted above, the floating gate is self-aligned in the source-to-drain direction to the channel beneath it in the sense noted above. Therefore, in the source-to-drain direction there is no overlap of the floating gate beyond the channel and over the source or drain regions, except as the source and drain may have diffused beneath the floating gate. Nevertheless, the situation is different in the direction transverse to the source to drain direction. In the direction perpendicular to the source-to-drain direction, that is, the transverse direction, the floating gate extends substantially beyond the channel region. Note FIG. 8 of the patent. A somewhat similar situation prevails with respect to the product mentioned above. In the cell of the product, the control gate seems to be substantially aligned with the underlying floating gate in the source-to-drain direction. Nevertheless, the floating gate still extends beyond the channel substantially in the transverse direction and therefore restricts the density with which the cells may be packed in that direction. The nature of the restriction will become more apparent by reference to FIG. 1 which shows in somewhat diagramatic form the nature of the product cell.

Figure 1:
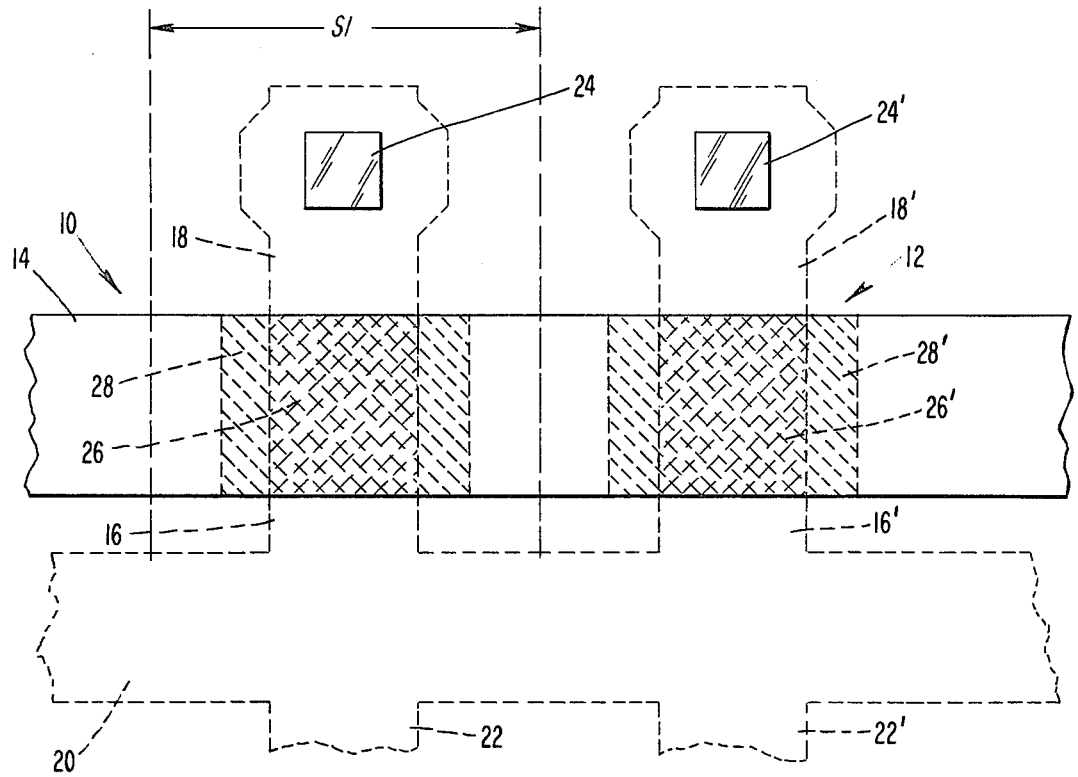
FIG. 1 is a plan view of the prior product device mentioned above.

In FIG. 1 a cell 10 of the memory product mentioned above is shown in plan view on the surface of an underlying substrate adjacent to a neighboring cell 12. A row control line 14 overlies the row of cells including the cells 10 and 12. A source 16 and a drain 18 are formed as surface regions of the substrate. The source 16' and 18' of the neighboring cell are also indicated. A source line 20 may be provided by extending the appropriately doped source regions. Connections may be made in mirror image fashion to adjacent source regions from the source line 20 by regions 22, 22'. Drain contact paths 24 and 24' are fashioned in a known way to provide contacts to the drain areas. The channel region or channel 26 indicated by the double cross hatching connects the source and drain regions. Overlying the channel 26 is the floating gate 28, that portion extending beyond the underlying channel 26 being indicated by the single hatching. Considering FIG. 1, it will become apparent that the center lines between adjacent cells in the direction perpendicular to the source-to-drain direction are separated by the distance S1.

EMBODIMENT OF THE INVENTION

Figure 2:
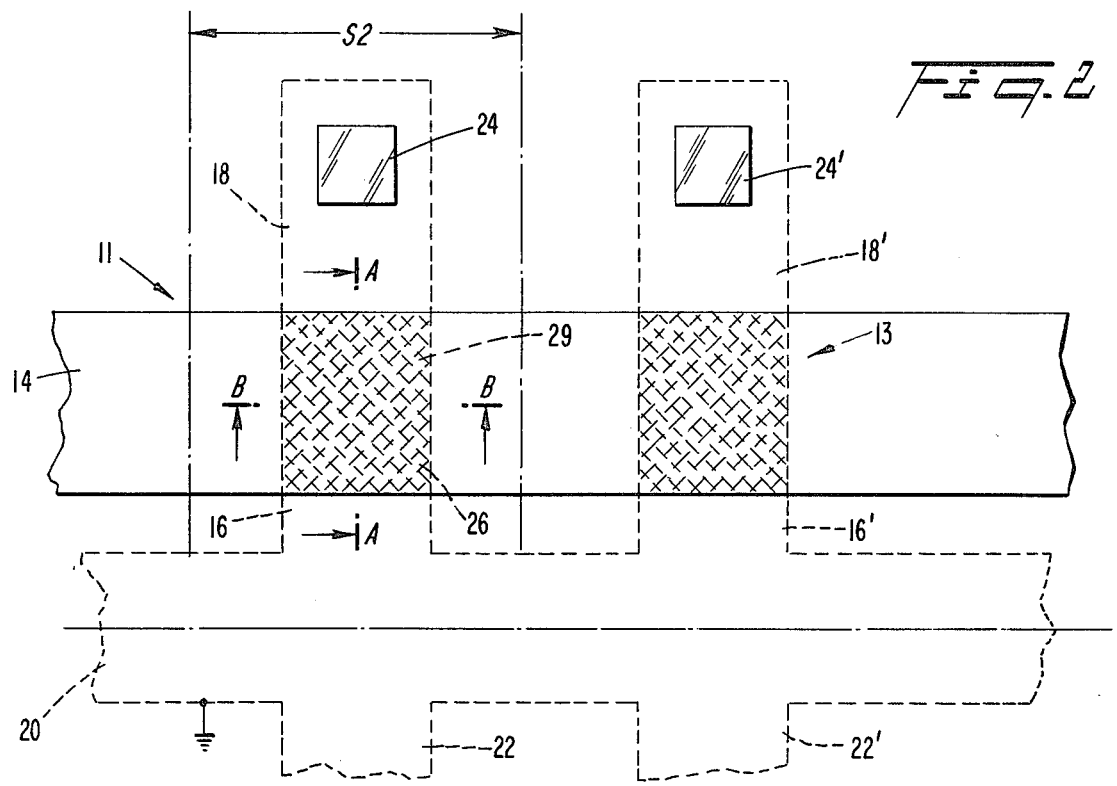
FIG. 2 is a plan view of an embodiment of the invention.

A similar plan view of an embodiment of the invention is illustrated in FIG. 2 and cross-sectional views 9A and 9B along the lines A—A and B—B respectively of the central portion of the embodiment of FIG. 2. Similar parts bear similar reference numerals. Note that in the direction perpendicular to the source-to-drain direction the floating gate 29 does not extend over the field oxide but is the same width as the channel 26. Therefore, the distance S2 representing the distance which is allotted to a cell in the direction perpendicular to the source-to-drain direction is less in FIG. 2 than in FIG. 1. In fact, in both the source-to-drain direction and the direction perpendicular thereto, the floating gate overlies and is coextensive with the channel 26, except for possible diffusion spread beneath it. Therefore, for a cell otherwise similar, except for the feature of the non-extending floating gate, a cell constructed according to the invention permits denser packing of cells in a like surface area of the substrate than the prior constructions.

METHOD OF MANUFACTURE

Referring to FIGS. 3A and 3B, manufacture of the cell of the invention starts with a chip or a substrate 40 of silicon lightly doped in one conductivity for example p type as indicated by a p— on the drawing. The surface layer 42 of chip or substrate 40 may be treated to afford a somewhat higher conductivity of the one type indicated by p+, either over the entire chip, or selectively by methods known in the art.

A thin layer 44 of silicon oxide is grown upon the surface of the substrate 40 over the enhanced conductivity layer 42. Upon the silicon oxide layer 44 is deposited a layer of polysilicon 46 which is polycrystalline silicon.

Over the polysilicon layer 46 is deposited a slow oxidizing material, such as a silicon nitride layer 48. The result is a structure somewhat as shown in FIGS. 3A and 3B. It should be recognized that the representation is largely schematic and not intended to be to scale, even relatively.

After deposition of the silicon nitride layer, a photo resist is applied over the surface of the silicon nitride layer 48. The photo resist is exposed in a pattern which hardens the resist which overlies the future floating gate. The remainder of the photo resist is washed away. The silicon nitride is then etched, leaving a layer of silicon nitride overlaying the future polysilicon gate 29 and source, drain and channel but restricted in the direction transverse to the source-to-drain direction to substantially the final dimension of the floating gate. Thereafter, the photo resist may be removed entirely and the polysilicon layer 46 removed except for that underlying the remaining silicon nitride, by dipping in a preferential etching solution. The polysilicon gate 29, the extent of which in the direction transverse to the source-to-drain direction is now defined, remains under the portion of the unetched silicon nitride 48 which acts as a shield or mask to protect the underlying polysilicon floating gate 29. The polysilicon layer 46 remains over the source, drain and channel of each cell. The structure which remains then has an appearance such as illustrated in FIGS. 4A and 4B. Even though a large portion of the silicon nitride layer 48 has been removed, the same identifying numeral has been retained for the remaining portion of the layer, for convenience.

Now, a rather heavy layer 50 of silicon oxide is grown over all, and a thinner layer over the silicon nitride layer 48. As is known, silicon oxide grows rather slowly over silicon nitride. The layer 50 therefore accumulates oxide much more rapidly over the portions without silicon nitride than over the portions covered by silicon nitride. If desired, a thin layer of the grown oxide 50 over the silicon nitride layer and elsewhere may be removed leaving the silicon nitride as the insulation between the floating gate 29 and the future control gate. Preferably this thin layer of oxide throughout including that over the silicon nitride 48 is removed, the silicon nitride is preferentially etched away, and a further thin layer 50A of silicon oxide is grown as an accretion to the layer 50 and also forming a thin layer over the polysilicon floating gate 29. The resultant sections would appear somewhat as illustrated in FIGS. 5A and 5B.

Then a layer of conductive polysilicon 52 is applied over the silicon oxide 50 as illustrated in FIGS. 6A and 6B. Next, a layer of photo resist 54 is spread over the second layer 52 of polysilicon and patterned by exposure in a fashion to serve as the master or pattern 54 for the second layer of polysilicon 52 to be retained. After etching the polysilicon layer 52, the pattern of layers 52 and 54 will be continuous in the direction perpendicular to the source-to-drain direction in the plane of the section B—B, and less wide in the source-to-drain direction (section A—A) than the underlying remainder of the first polysilicon layer 46 as may be noted by reference to FIGS. 7A and 7B. In the source-to-drain direction, the photo resist pattern 54 and second conductive polysilicon layer 52 will serve as a mask to etch the excess of the future floating gate first polysilicon layer 29.

Now using the remaining pattern of photo resist 54 as a mask, at least enough of the oxide 50A is removed to expose the underlying polysilicon layer 46. Thereafter the polysilicon layer 46 is etched using the photo resist layer 54 and second polysilicon layer 52 as a mask. Then the photo resist layer 54 may be removed. The resultant structure is as illustrated in FIGS. 8A and 8B.

In the source-to-drain direction, the newly patterned floating gate 29 is now etched to the same dimension as the overlying control gate 52 and the former photo resist layer 54 that protected the control gate in this direction, and is coextensive with the underlying channel 26. Both the first polysilicon layer 29 and the second polysilicon layer 52 remain in a pattern determined by the photo resist layer 54 as they were protected thereby. Under the first polysilicon layer 29 remains gate oxide under which is the future channel. Note that in the source to drain direction all the edges of the second polysilicon layer 52, of the underlying oxide 50A, and of the underlying floating gate 29 are all aligned alike, as shown in FIG. 8A.

Then the unprotected thin oxide 44 is dissolved to expose layer 42. The stack of control gate polysilicon 52, oxide 50A, floating gate polysilicon 29, and oxide 44 remain aligned over channel 26. The source S and drain D may be formed by any suitable method, such as ion implant or diffusion, leaving a structure as in FIGS. 9A and 9B. The functions of the source and drain may be interchanged. Note that the edges in the source-to-drain direction of the stack of: second polysilicon 52, underlying oxide 50A, underlying polysilicon 29, and underlying gate oxide and channel 26 are all aligned exactly with each other. Thus, the protective layer of photo resist 54 defined the second polysilicon layer 52 and served as a mask in the source-to-drain direction for formation of the edges of the floating gate and of the coextensive source and drain, S and D, formed beneath. The polysilicon floating gate 29 does not extend beyond the channel over the surrounding oxide 50. Moreover, the elements of the stack are formed in a manner which uses either the second polysilicon layer 52 or the mask from which it was formed as the mask for their formation. Hence, all are self-aligned to each other in the source-to-drain direction.

Now, the device may be completed by growing or depositing a further oxide 57, using a photo resist pattern which will enable removal of the oxide to the source and drain for the purpose of applying a suitable metallization 58, 60 for contact to the source S and drain D respectively for contact, as illustrated in FIGS. 10A and 10B, and completing any other desired insulation and connections. Before metallization, heavier doping as at 59, 61 may be applied to improve the contact with the metallization 58, 60. The source and drain may be completed before removing the oxide layer 44 by ion penetration, or after by ion penetration or diffusion.

CONCLUSION

Accordingly, it will be apparent that there has been described a floating gate memory cell in which the floating gate is self-aligned and coextensive with the underlying channel both in the source-to-drain direction and in the direction perpendicular to the source and drain direction. The floating gate therefore does not overlap or extend over the field oxide, but is restricted to the gate oxide. Moreover, the control gate is coextensive with and self-aligned to the floating gate in the source-to-drain direction. The cell as disclosed is conservative of the available operative area of a chip or substrate in the construction of a memory, and permits higher density of cells per unit area than prior constructions for like area of effective or operative floating gate and control gate construction.

What is claimed is:

1. A floating gate memory cell comprising:
   a semiconductor substrate of one conductivity type,
   source and drain surface regions on said substrate of the opposite conductivity type and a channel region connecting said surface regions,
   a conductive floating gate insulated from, overlying and substantially coextensive with said channel region in the direction transverse to the source-to-drain direction and insulated from said channel region,
   a conductive control gate overlying and insulated from said floating gate and coextensive with said floating gate in the source-to-drain direction.
2. A memory cell as claimed in claim 1, said one conductivity type being p type.
3. A memory cell as claimed in claim 1, said floating gate being heavily doped polycrystalline silicon.
4. A memory cell as claimed in claim 1, the floating gate being insulated from said channel by silicon oxide.
5. A memory cell as claimed in claim 1, said control gate being insulated from said floating gate by insulation comprising silicon nitride.
6. A memory cell as claimed in claim 1, said control gate being insulated from said floating gate by insulation comprising silicon oxide.
7. A memory cell as claimed in claim 1, said floating gate being self-aligned to said channel region in the source-to-drain direction.
8. A memory cell as claimed in claim 7, the floating gate being insulated from said channel by silicon oxide.
9. A memory cell as claimed in claim 8, the control gate being insulated from said floating gate by silicon oxide.
10. A memory cell as claimed in claim 8, the control gate being insulated from said floating gate by silicon nitride.